United States Patent [19]

Tsuchiaki

[11] Patent Number: 5,895,255
[45] Date of Patent: Apr. 20, 1999

[54] SHALLOW TRENCH ISOLATION FORMATION WITH DEEP TRENCH CAP

[75] Inventor: Masakatsu Tsuchiaki, Fishkill, N.Y.

[73] Assignee: Kabushiki Kaisha Toshiba, Kawasaki, Japan

[21] Appl. No.: 08/496,692

[22] Filed: Jun. 29, 1995

Related U.S. Application Data

[63] Continuation of application No. 08/351,161, Nov. 30, 1994, abandoned.

[51] Int. Cl.$^6$ .................................................. H01L 21/76
[52] U.S. Cl. ........................... 438/427; 438/700; 438/705; 438/945
[58] Field of Search ..................... 437/52, 67, 228 TR, 437/228 M, 984; 148/DIG. 102; 438/427, 700, 705, 945, FOR 103, FOR 118, FOR 227, FOR 435, FOR 495

[56] References Cited

U.S. PATENT DOCUMENTS

| | | | |
|---|---|---|---|
| 4,365,347 | 12/1982 | Lien et al. ........................... | 29/591 |
| 4,390,393 | 6/1983 | Ghezzo et al. . | |
| 4,546,538 | 10/1985 | Suzuki ............................... | 29/576 |
| 4,593,459 | 6/1986 | Poppert et al. ...................... | 29/577 |
| 4,741,802 | 5/1988 | Okumura ............................ | 56/648 |
| 4,778,563 | 10/1988 | Stone . | |
| 4,795,721 | 1/1989 | Bower et al. . | |
| 4,886,764 | 12/1989 | Miller et al. . | |
| 4,889,828 | 12/1989 | Jeuch . | |
| 5,001,085 | 3/1991 | Cathey et al. . | |
| 5,013,680 | 5/1991 | Lowrey . | |
| 5,041,394 | 8/1991 | Spratt et al. . | |
| 5,047,367 | 9/1991 | Wei et al. . | |
| 5,143,862 | 9/1992 | Moslehi . | |
| 5,194,405 | 3/1993 | Sumi et al. . | |
| 5,215,602 | 6/1993 | Dhong et al. ........................ | 365/207 |
| 5,221,853 | 6/1993 | Joshi et al. .......................... | 257/384 |
| 5,256,597 | 10/1993 | Gambino . | |
| 5,270,256 | 12/1993 | Bost et al. . | |
| 5,288,666 | 2/1994 | Lee . | |
| 5,302,552 | 4/1994 | Duchateau et al. . | |
| 5,360,758 | 11/1994 | Bronner et al. ..................... | 437/52 |
| 5,369,049 | 11/1994 | Acocella et al. .................... | 437/52 |
| 5,389,559 | 2/1995 | Hsieh et al. ........................ | 437/52 |
| 5,426,067 | 6/1995 | Ogawa ............................... | 437/67 |

FOREIGN PATENT DOCUMENTS

| | | |
|---|---|---|
| 0 265 616 | 5/1988 | European Pat. Off. . |
| 5791535 | 6/1982 | Japan . |
| 57204146 | 12/1982 | Japan . |
| 63142820 | 6/1988 | Japan . |
| 63-164357 | 7/1988 | Japan . |

OTHER PUBLICATIONS

L. Nesbit et al.; "A 0.6 $\mu m^2$ 256Mb Trench DRAM Cell With Self–Aligned BuriEd STrap (Best) "; pp. 262.1–262.4. (date unknown).

"Self–Aligned Oxide–Filled Deep/Shallow Trench Isolation With One Fill/Planarization Step",IBM Technical Disclosure Bulletin, vol. 35, No. 4B, Sep./1992, pp. 253–255.

*Primary Examiner*—George R. Fourson
*Attorney, Agent, or Firm*—Banner & Witcoff, Ltd.

[57] ABSTRACT

A composite body includes a semiconductor substrate having an oxide layer formed thereon and a nitride layer formed over the oxide layer. First and second deep trench configurations are formed in the composite body. To form a shallow isolation trench between the first and second deep trench configurations, intrinsic polysilicon upper layers of the first and second deep trench configurations and the nitride layer are planarized. A titanium layer is formed over the planarized composite body and caused to react with the intrinsic polysilicon upper layers to form first and second titanium silicide caps over the first and second deep trench configurations. A masking layer is formed over the composite body such that an opening exposes the region between the first and second deep trench configurations. An etching step that is selective to titanium silicide is then performed with the first and second deep trench caps serving as masks. Accordingly, a shallow trench is formed in the region between the first and second trench configurations. The masking layer and the first and second deep trench caps are removed, and oxide and nitride linings are formed over the first and second deep trench configurations and over the surfaces of the shallow trench to prevent oxidation.

20 Claims, 10 Drawing Sheets

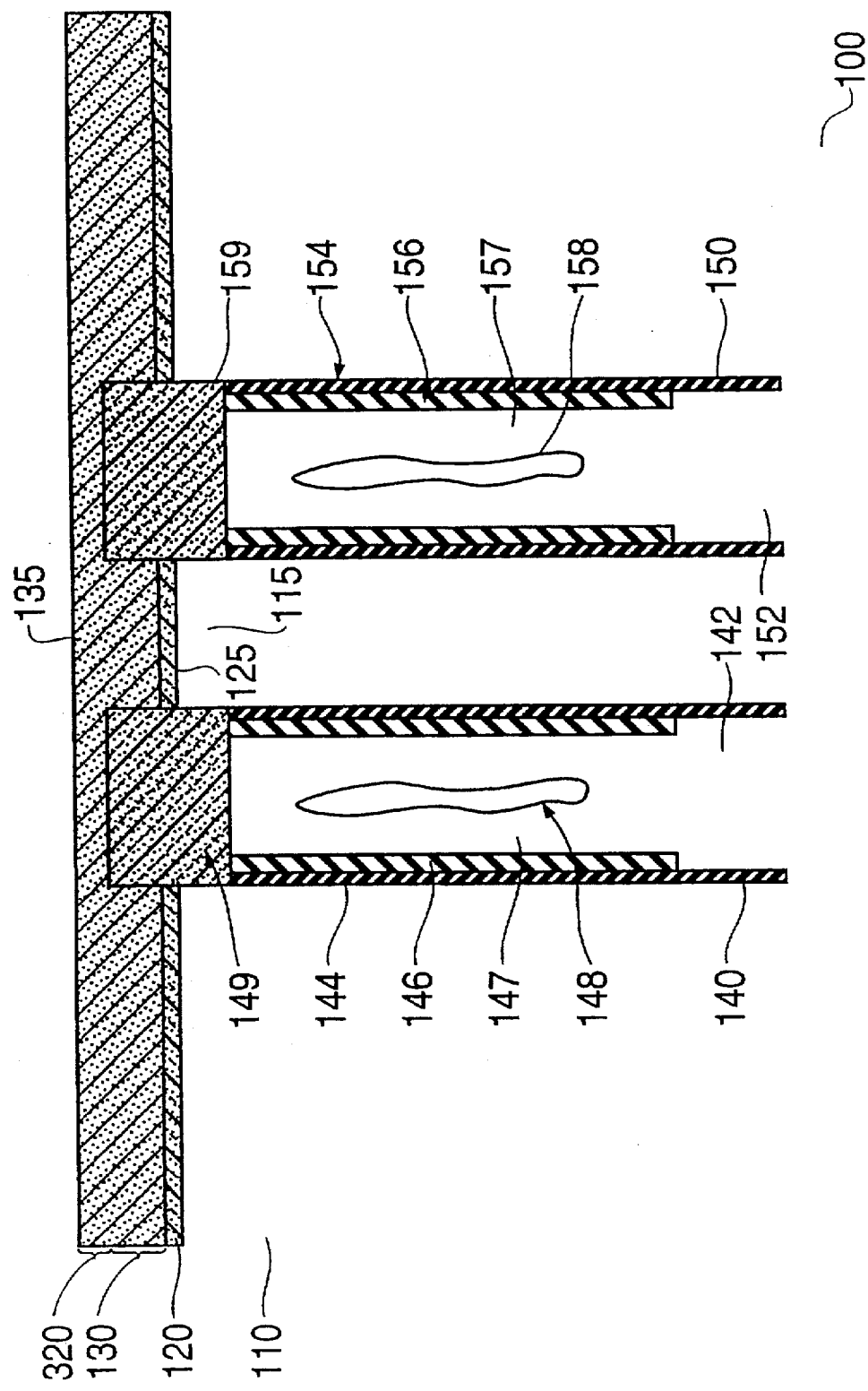

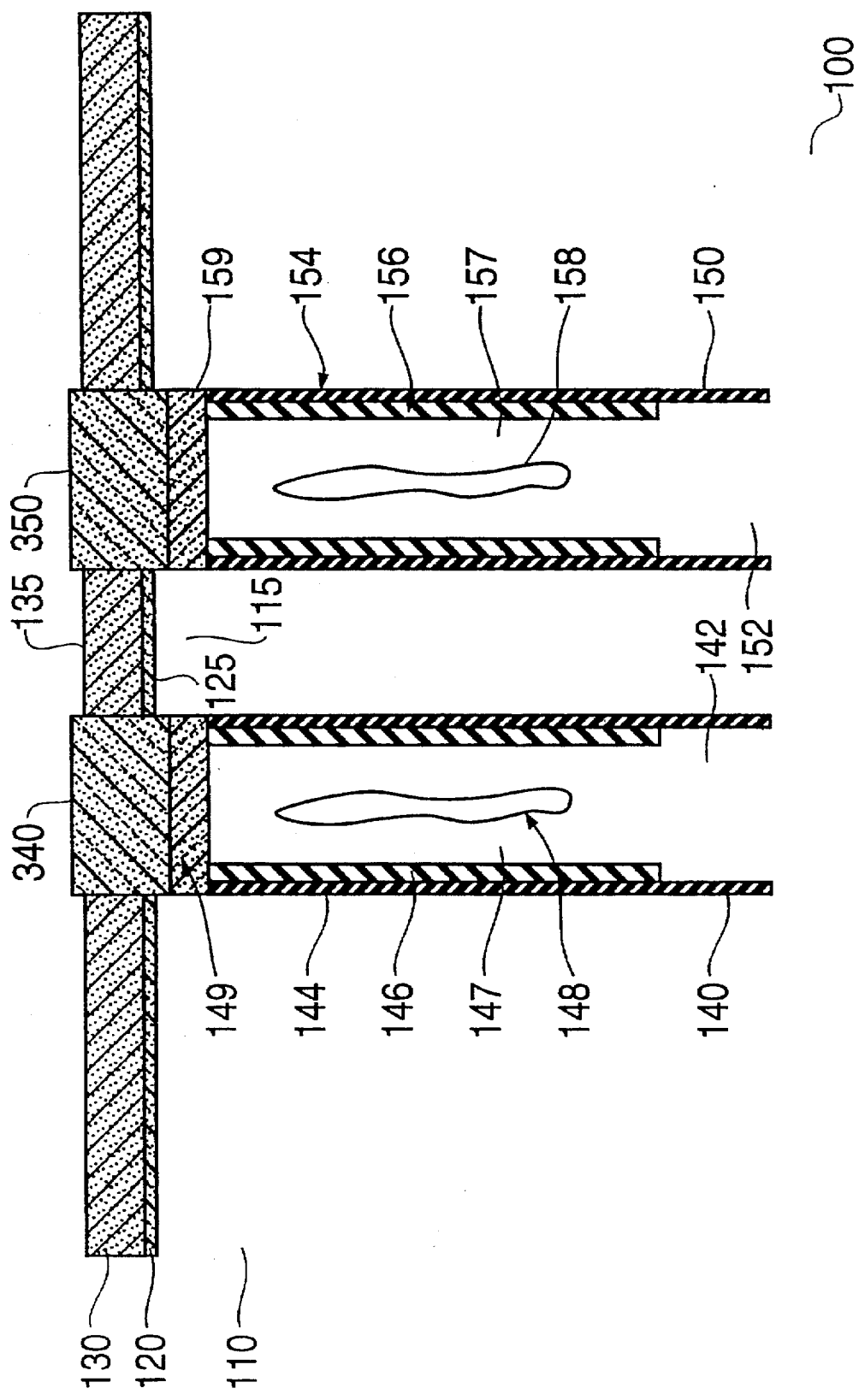

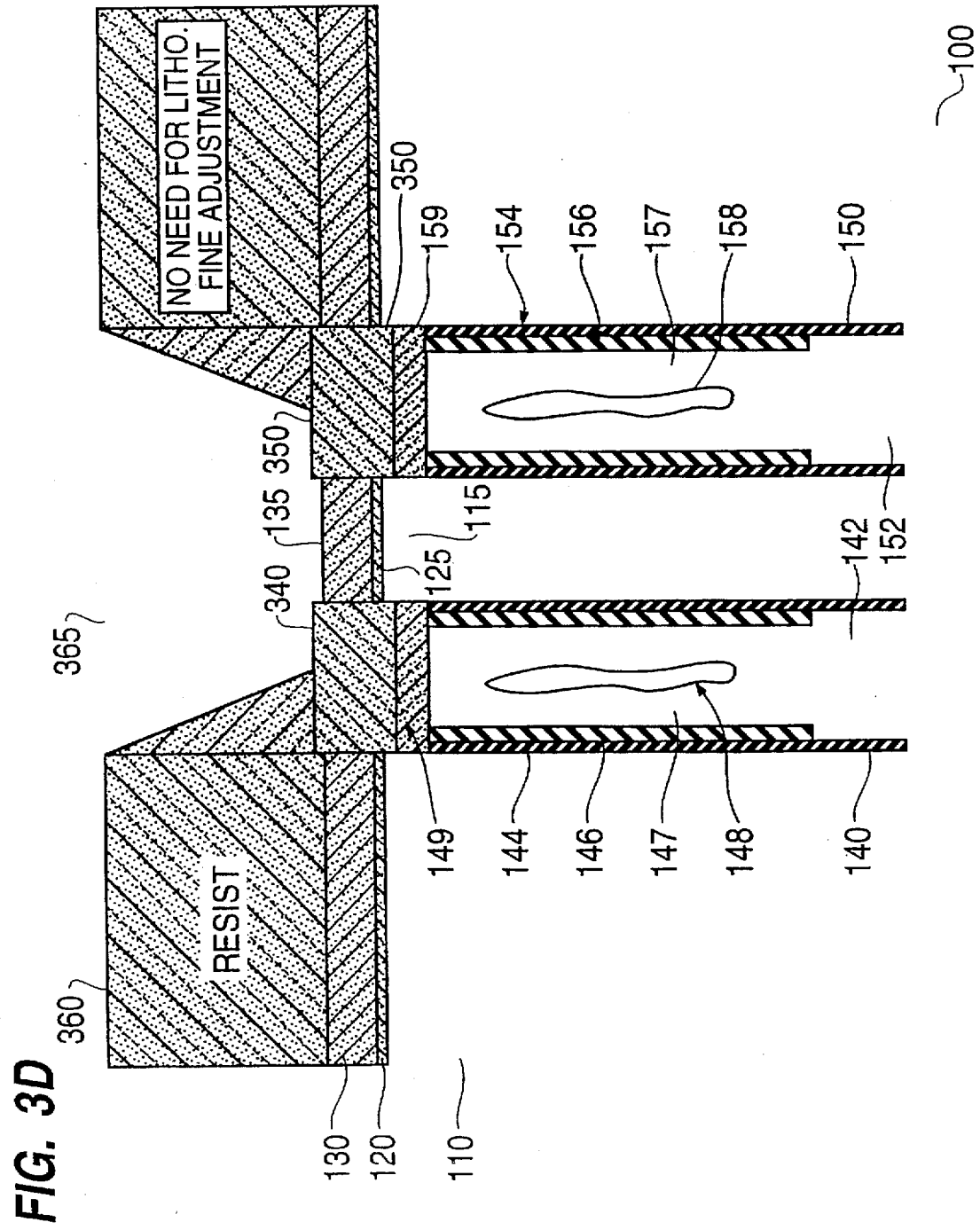

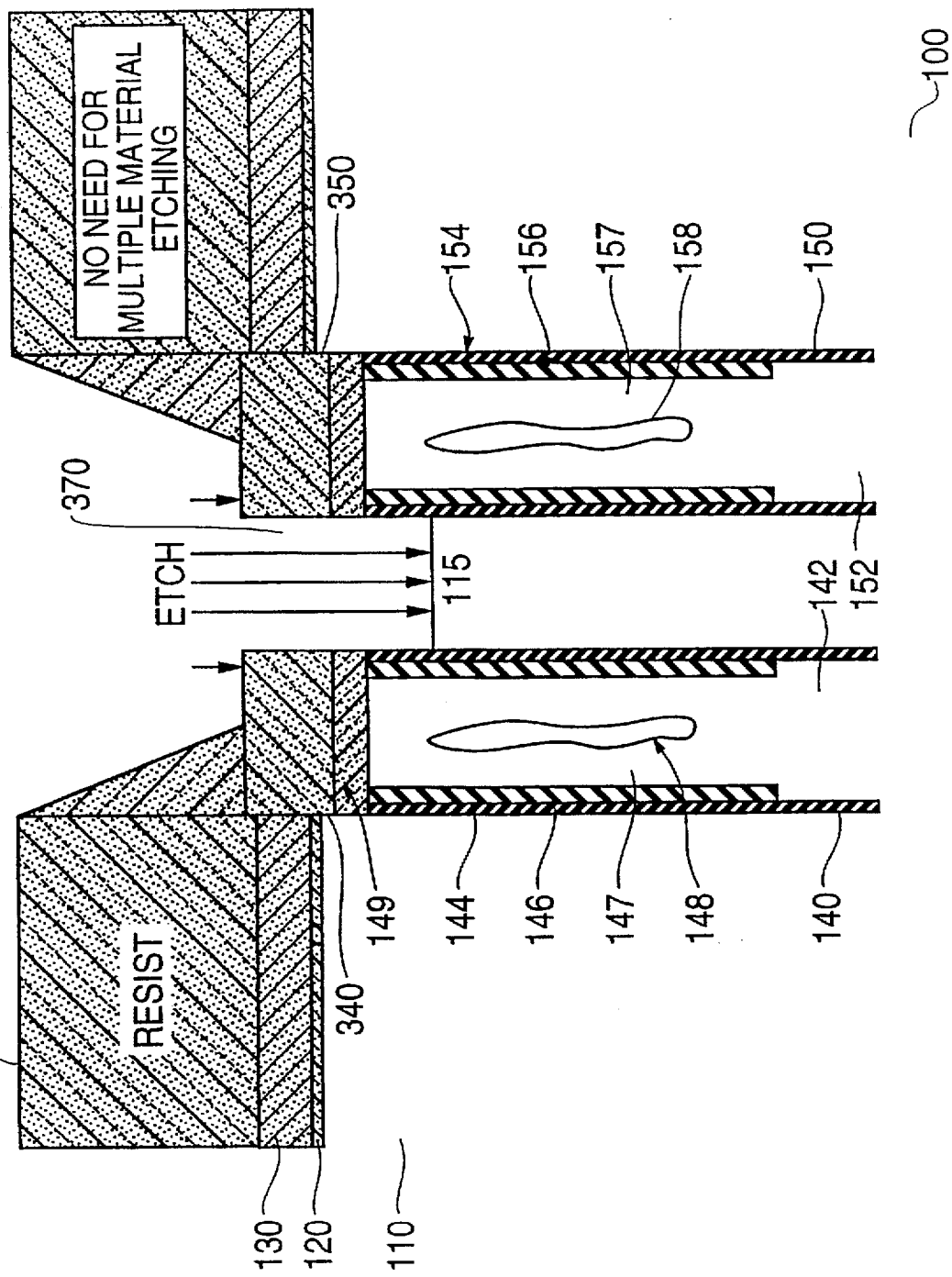

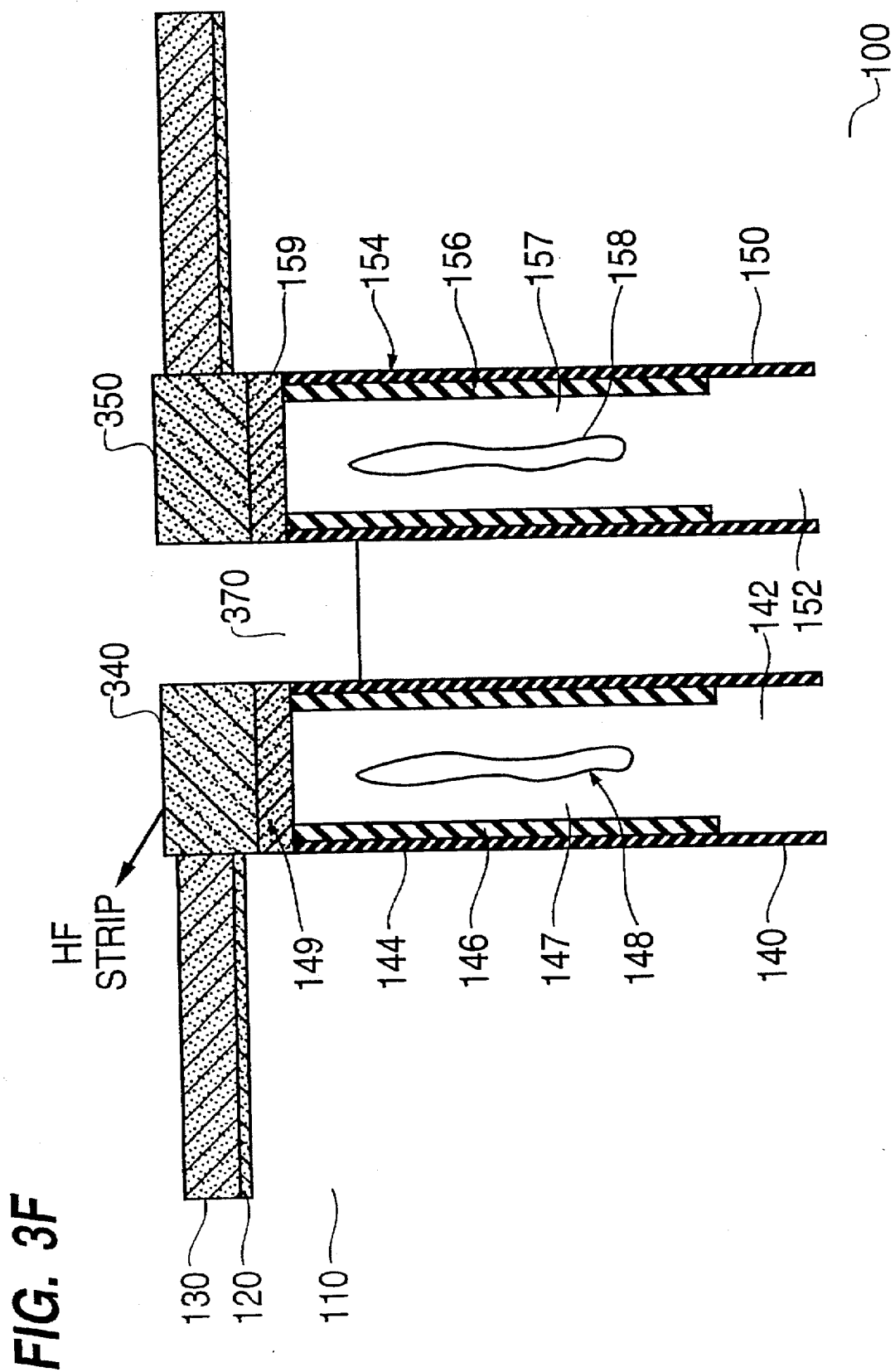

5,895,255

SHALLOW TRENCH ISOLATION FORMATION WITH DEEP TRENCH CAP

This application is a continuation of application Ser. No. 08/351,161, filed Nov. 30, 1994, now abandoned.

FIELD OF THE INVENTION

The invention generally relates to the formation of trenches in a material, and more particularly to the formation of shallow trenches in a semiconductor substrate for isolating adjacent deep trench configurations.

BACKGROUND OF THE INVENTION

Deep trench configurations are commonly used in semiconductor devices, for example, as storage capacitor components for memory cell devices. In such a case, each discrete memory cell device may include a deep trench configuration coupled to a planar device, such as a switching or gate transistor which controls the charge held by the deep trench configuration. In order to form an electrical connection between a portion of the planar device formed at the planar semiconductor substrate surface and an interior of the deep trench configuration, material that can be made conductive is formed between the deep trench configuration and the planar device. This material is commonly referred to as a strap.

The memory cell device described above represents information based upon whether or not the deep trench configuration is charged. In general, shallow trench isolation (STI) may be used to isolate discrete memory cell devices to prevent interference therebetween. Accordingly, shallow isolation trenches are formed between adjacent deep trench configurations to ensure that they operate independently. However, shallow trench isolation of two closely located deep trench configurations, as well as individual strap formation for each of the deep trench configurations, requires meticulous adjustment of pertinent fabrication processes such as lithography and etching, especially when the closest distance between trenches falls below 0.25 μm. As a result, the fabrication process tolerance is narrowed and stringent quality control of each processing step is required. Therefore, the memory cell devices are difficult to manufacture. Some of these problems associated with device manufacture will be illustrated by the following example.

FIG. 1 illustrates a portion of a composite body 100 including a semiconductor substrate 110 having a pad oxide layer 120, for example, $SiO_2$, formed thereon. The semiconductor substrate 110 may be formed of, for example, crystal silicon. A layer 130 is formed over the pad oxide layer 120. The layer 130 may be formed of a nitride, such as $Si_3N_4$. Of course, other silicon nitride compounds, e.g. $Si_{3\pm x}N_{4\pm y}$, may be used depending on the characteristics desired. The oxide layer 120 and the nitride layer 130 serve as masks for pertinent fabrication processes such as etching, oxidation, and/or chemical-mechanical polishing (CMP), for example. First and second deep trenches 140, 150 are formed in the nitride layer 130, the oxide layer 120, and the semiconductor substrate 110. A nitride region 135, an oxide region 125, and a semiconductor substrate region 115 are disposed between deep trenches 140, 150. First and second deep trench configurations 142, 152 are constructed in first and second deep trenches 140, 150, respectively.

Each of first and second trench configurations 142, 152 includes a thin insulator film 144, 154 formed on the interior surface of the trench 140, 150, a thick insulator film 146, 156 formed over the thin insulator film 144, 154 at a middle portion of the trench 140, 150, and storage node material 147, 157 formed to fill the inside of the respective deep trenches 140, 150 to the height of the thin insulator film 144, 154 and the thick insulator film 146, 156. However, filling the deep trenches 140, 150 is difficult because of their high aspect ratios. As a result, voids 148, 158 are formed in the storage node material 147, 157. Strap material 149, 159 is formed on top of the thin insulator film 144, 154, the thick insulator film 146, 156, and the storage node material 147, 157 to fill the interior of the deep trenches 140, 150 to a level somewhere below the surface of the semiconductor substrate 110. Therefore, the strap material 149, 159 directly contacts with both the semiconductor substrate 110 around the deep trench configurations 142, 152 and the top of the storage node material 147, 157 as illustrated in FIG. 1.

The thin insulator films 144, 154 may be formed of silicon nitride, for example, $Si_3N_4$, and serve to form a capacitance between the storage node material 147, 157 and the semiconductor substrate 110. The thick insulator films 146, 156, which may be formed by chemical vapor deposition (CVD) of tetraethylorthosilicate (TEOS) $Si(OC_2C_5)_4$, isolates the storage node material 147, 157 from the surrounding semiconductor substrate 110. Storage node material 147, 157 serve as storage nodes, and may be formed of, for example, n+ polysilicon. The strap material 149, 159 may be formed from intrinsic polycrystalline silicon.

When the composite body 100 is constructed as a part of memory device, STI is used to electrically isolate deep trench configurations 142, 152 from one another and to delineate the regions on which planar devices are formed. It should be noted that before STI formation processes are initiated, all storage nodes are connected to the semiconductor substrate 110 by the straps 149, 159. After shallow trench formation, insulating material is used to fill the shallow trenches up to the surface of the composite body 100. Thus, after completion of STI formation processes, straps as well as deep trenches are completely buried beneath the insulating film. This type of strap formation, i.e. buried strap, is advantageous because it allows subsequent processes to be completed on a planar surface. Flat topography is critical to produce excellent resolution in lithography. Planar devices, including switching transistors coupled to the respective deep trench configurations 142, 152, are then fabricated using surface device fabrication techniques currently known in the art.

Conventionally, portions of the first and second deep trench configurations 142, 152 are etched together with nitride region 135, oxide region 125, and semiconductor substrate 115 in a region indicated by 160 in FIG. 1. This ensures isolation between adjacent deep trench configurations despite slight misalignment and poor resolution in the lithographic stage of the STI process. In addition, capacitive coupling between the storage node of a deep trench configuration and gate material running above it can be reduced. To effect the etch, a resist layer is formed over the composite body 100 illustrated in FIG. 1 and developed to form a pattern for etching. FIG. 2 illustrates a shallow trench 210 formed between the first and second deep trench configurations 142, 152 by etching the composite body 100 through opening 220 in resist layer 230 according to conventional techniques. However, several disadvantages and difficulties exist when the shallow trench is formed by such conventional technique.

First, as can be seen most clearly in FIG. 1, the upper surface of the composite body 100 has recesses 170, 180 resulting from the different levels of the upper surfaces of pad nitride layer 130 and strap layers 149, 159. The recesses 170, 180 include step portions 171, 172, 181, and 182 formed at the respective edges between the upper surface of the pad nitride layer 130 and the upper surfaces of the strap layers 149, 159 of the first and second deep trench configurations 142, 152. The step portions 171, 172, 181 and 182 may have a height of, for example, about 2000 Angstroms. In order to have a desired pattern or shallow trench etching mask, resist should be developed as shown in FIG. 2, with a definitive edge at the middle of the strap layer, which is recessed from the surface level of the semiconductor substrate 110. However, when resist is applied to a surface that has step formations, light passes through the resist and reflects from both the substrate surface and the recessed surface. The light reflected from the recessed surface interferes with incoming light differently than the light reflected from the substrate surface thereby causing an undesirable resist profile after development. The interference pattern and, as a consequence, the resist profile are dependent on the height of the step. Thus, resolution at the edge of the resist profile is poor and very sensitive to variations in step height. Accordingly, the process window for lithography is narrow and repeatability of the process is impaired.

Furthermore, etching the shallow trench is itself difficult because the semiconductor substrate region 115, portions of the intrinsic polysilicon strap layers 149, 159, portions of the thin nitride insulator 144, 154, portions of thick oxide insulator 146, 156, portions of n+ polysilicon storage node material 147, 157, the pad nitride region 135, and the pad oxide region 125 must all be removed. While the pad nitride region 135 and the pad oxide region 125 may be etched using a process selective to silicon, a simultaneous, multi-material etch of polysilicon, nitride, and oxide is required. The problem is compounded by the fact that the polysilicon, nitride, and oxide do not form a planar surface. Therefore, an extremely non-selective etching technique is required.

Moreover, as noted above, lithography produces poor resolution of the edges of resist above the deep trench configurations 142, 152. Because etching processes for forming tapered trenches are more susceptible to inaccuracies caused by resist profile variation, shallow trenches are formed by etching processes that produce highly vertical trench profiles. In addition, tapered shallow trenches are more vulnerable to misalignment. To minimize the adverse effect of poor resolution of lithography and misalignment, vertical etching is required.

The requirement of a vertical trench profile conflicts with the requirement of non-selective etching. This imposes severe restrictions on the etching procedure. For example, a deposition-type etching process that forms a deposition film on the vertical plane cannot be used because the film also deposits on the horizontal plane of each material differently and thus induces etching rate disparities between materials. Accordingly, the resulting etch becomes selective which is inconsistent with the requirement of non-selectivity. However, it is difficult to control the trench profile without an etching process that also forms a deposition film. Due to the rigid restrictions placed upon the etching procedure, even a slight variation in etching conditions produces a relatively large decrease in etching performance.

Further, there is at least one problem inherent in transistors delineated and isolated by shallow trenches having a highly vertical profile. Sharp corners formed by the shallow trench sidewall and the semiconductor substrate surface modify the local electric field distribution so as to reduce the local threshold voltage. Accordingly, the threshold voltage of the channel region adjacent to the shallow trench sidewall has a lower value than that at the center of the channel region. The lower threshold at the corner is detrimental to the cut-off characteristics of the transistor and may cause leakage current. For peripheral circuitry, which contains relatively large transistors having relatively large currents, the leakage current produces significant power dissipation. The leakage current in switching transistors, which are connected to the storage nodes, leads to the discharge of the storage nodes and thus a loss of information.

In order to obtain a good quality interface between the silicon and the shallow trench sidewall, thermal oxidation of the shallow trench interior surface is preferable. However, during this oxidation step, oxidant diffuses through the exposed thick oxide insulator and induces undesired oxidation of silicon in its vicinity. In addition, the interior surface of the storage node voids 148, 158, which may be formed of n+ polysilicon, as noted above, may be oxidized. Oxidation of silicon causes a volume expansion. Stress resulting from the expansion can lead to crystal defects such as dislocations in the crystal silicon semiconductor substrate. Such crystal defects modify the electrical properties of the semiconductor and cause junction leakage currents. Consequently, the retention time of a memory cell device, as well as other important characteristics, may be impaired. Accordingly, there exists a need to provide a method for forming a shallow trench between deep trench configurations that is easily implemented and that avoids the difficulties and disadvantages of conventional methods.

SUMMARY OF THE INVENTION

The aforementioned deficiencies of conventional techniques are avoided by the present invention in which a shallow trench is formed in a surface of a composite body having first and second deep trench configurations therein. The composite body includes a semiconductor substrate having a pad oxide layer formed thereon and a pad nitride layer formed on the pad oxide layer. The first and second deep trench configurations are formed in the semiconductor substrate through the nitride and oxide layers. The first and second deep trench configurations may comprise an insulator material and a conductive material formed in first and second deep trenches to produce a capacitor. In one preferred embodiment, each of the first and second deep trench configurations may include a thin nitride insulator lining, a thick oxide insulator lining, storage node filling material, and an intrinsic polysilicon upper layer. The upper surface of the composite body is planarized such that the first and second strap layers and the pad nitride layer form a continuous, planarized surface.

A titanium layer is formed over the planarized surface thereby overlying the first and second intrinsic polysilicon layers of the first and second deep trench configurations and the pad nitride layer. The composite body is then subjected to a silicidation process whereby the titanium layer and an upper portion of first and second polysilicon layers react to form first and second self-aligned deep trench caps made of titanium silicide. The first and second deep trench caps overlie the first and second deep trench configurations, respectively. The titanium layer is not reactive with the pad nitride layer, and the remaining titanium is stripped.

A masking layer, for example, resist, is provided over the composite body and an opening is formed therein to expose the pad nitride between the first and second deep trench configurations. Because the first and second deep trench caps can be used as masks in a subsequent etching step, the width of the opening and the profile of the opening on the deep trench caps become irrelevant. In addition, a wider alignment tolerance is afforded. Thereafter, etching selective to titanium silicide is conducted such that the silicon between the first and second deep trench configurations is etched to form a shallow trench. As noted above, the first and second trench configurations are protected from the selective etching step by the first and second deep trench caps, which are formed of titanium silicide and are therefore not subject to the etching. Thus, complex, multi-material etching is not required in accordance with the present invention. As a result, the etching process is not as severely constrained as conventional methods. For example, without the requirement of non-selective etching, an etching process may be used that allows tailoring of trench shape although it may induce etching rate disparity between materials. Accordingly, the trench areas surrounding a portion of the memory device region may be formed with a tapered profile to thereby inhibit leakage currents. Thus, the etching step forms a shallow trench sufficient to isolate the deep trench configurations without the difficulties of conventional techniques.

The masking layer and first and second deep trench caps are removed. The shallow trench interior surface are then oxidized. It should be noted that, being protected by straps and thin nitride insulator linings, there is no direct gateway for oxygen to the thick oxide insulator linings and the n+ polysilicon storage node. Subsequently, a nitride layer is formed over the oxidized shallow trench interior. Thus, deep trench configurations are now completely shielded against any oxidation steps thereafter. Undesired oxidation of silicon around the trench configuration and associated stress and crystal defect formation are avoided. Therefore, a shallow trench can be formed between the first and second trench configurations without encountering the difficulties and disadvantages currently experienced.

BRIEF DESCRIPTION OF THE DRAWINGS

A more complete appreciation of the present invention and many of the attendant advantages thereof will be readily obtained as the invention becomes better understood by reference to the following detailed description when considered in connection with the accompanying drawings.

FIGS. 3A–3G illustrate forming a shallow trench between first and second deep trench configurations in accordance with the present invention.

DETAILED DESCRIPTION OF THE PREFERRED EMBODIMENTS

Figure 1:
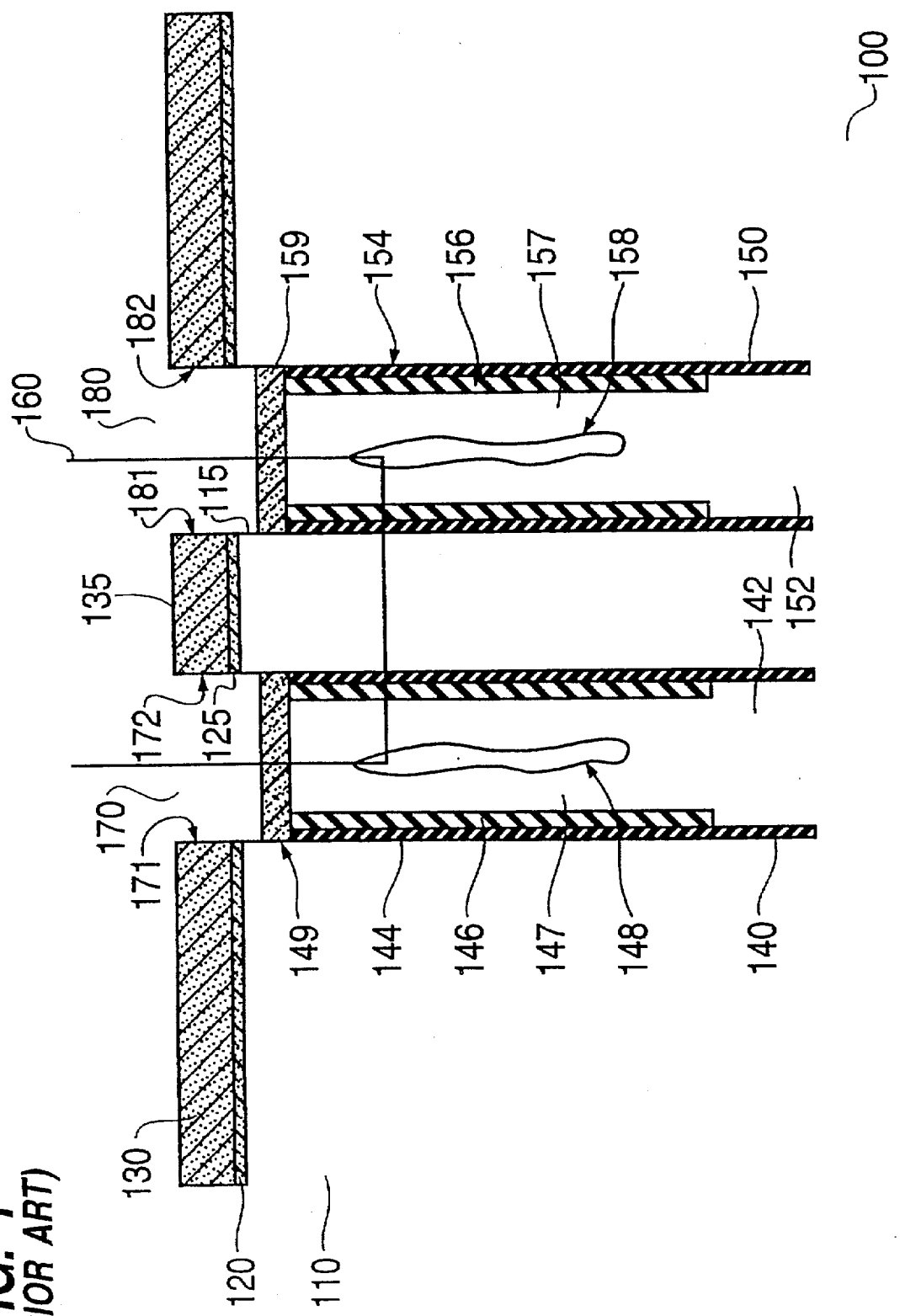
FIG. 1 illustrates a composite body having first and second deep trench configurations formed in a semiconductor substrate.
Figure 2:
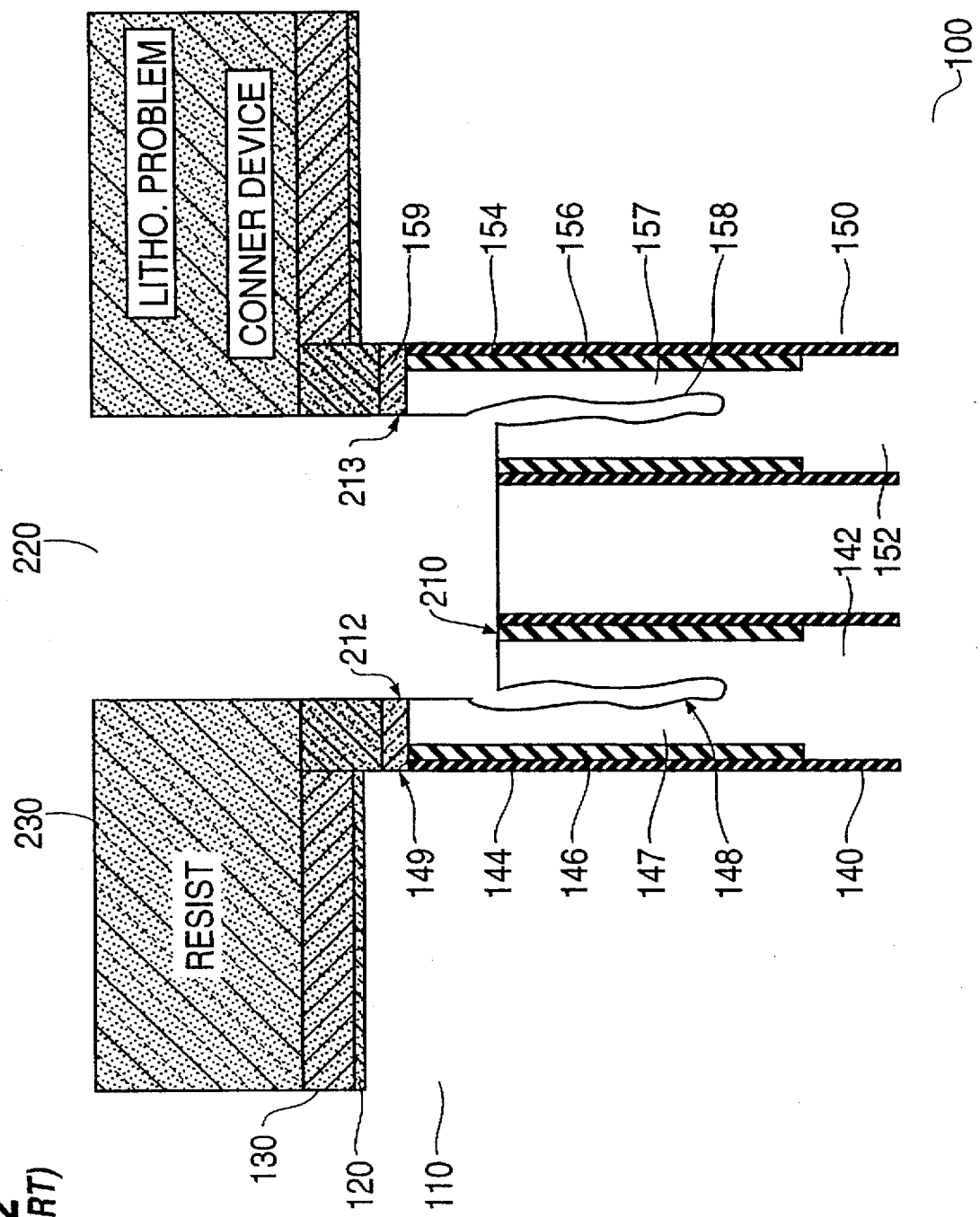
FIG. 2 illustrates a shallow trench formed between first and second deep trench configurations according to conventional processes.
Figure 3A:
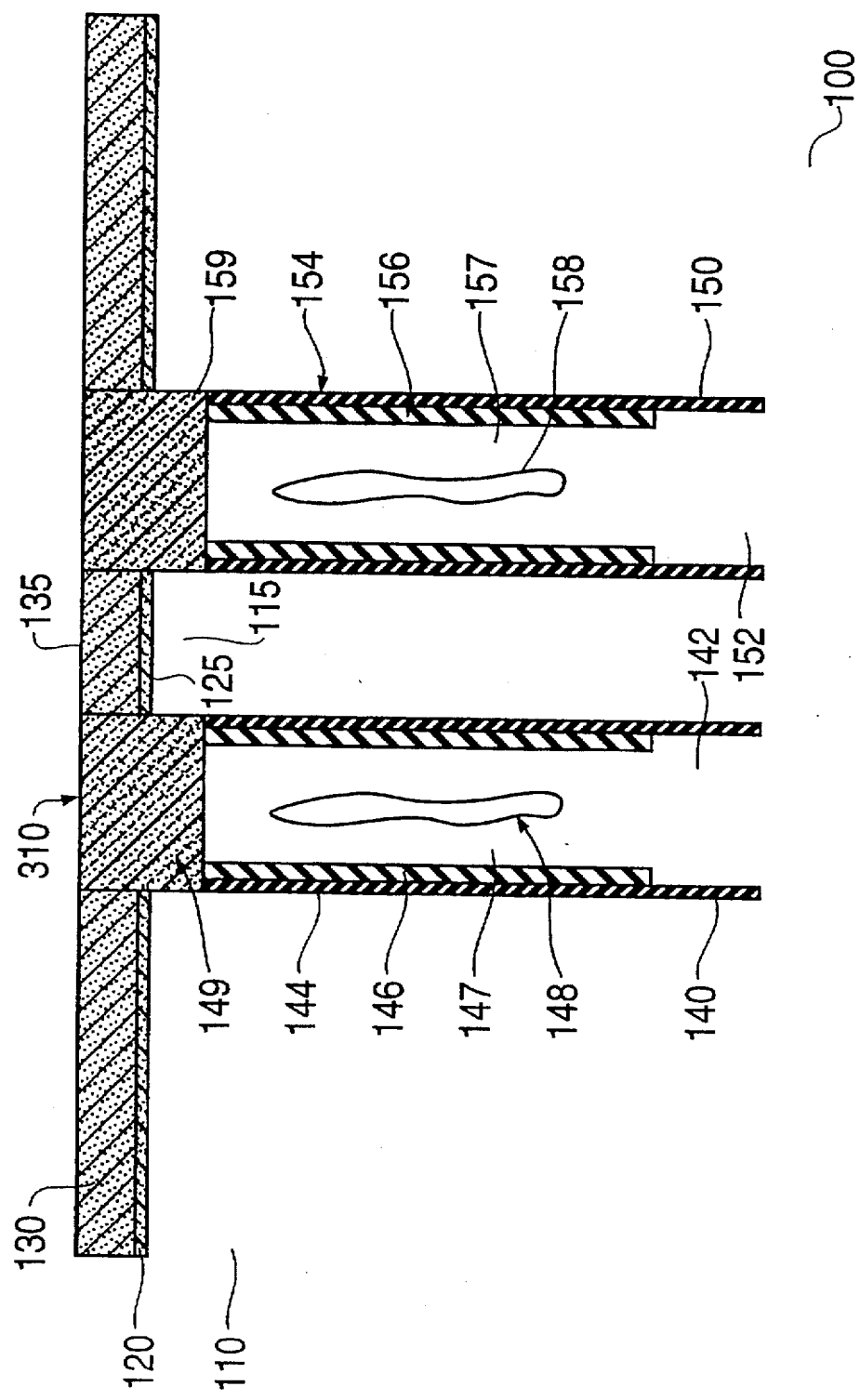

The present invention will now be described in connection with FIGS. 3A–3G. Corresponding structures in FIG. 1 and FIGS. 3A–3G are labelled with identical reference numerals, and a discussion thereof will be omitted. Of course, deep trenches 140, 150 may be formed according to techniques known in the art, such as reactive ion etching (RIE). Further, the deep trenches 140, 150 may be filled with any insulator material and any conductive material to form a capacitor structure using techniques known in the art. According to the present invention, the strap layers 149, 159, which may be formed of intrinsic polysilicon, are formed so as to completely fill the first and second trenches 140, 150. The surfaces of pad nitride layer 130 and intrinsic polysilicon layers 149, 159 are planarized to form a flat exterior surface 310 of the composite body 100 as illustrated in FIG. 3A. Planarization may be accomplished according to a variety of techniques known in the art. For example, planarization may be achieved by chemical-mechanical polishing.

As illustrated in FIG. 3B, a titanium (Ti) layer 320 is deposited on the planarized surface 310 according to known techniques, for example, by sputtering or evaporation. However, other materials may be used consistent with the present invention as long as they react selectively with Si of polysilicon layers 149, 159 and not with $Si_3N_4$ of layer 130 and they produce a compound removable by selective wet etch (e.g., using hydrofluoric acid (HF)) against Si and $Si_3N_4$. The composite body 100 is then subjected to, for example, thermal treatment that causes silicidation of the Ti layer 320, whereby Ti layer 320 and intrinsic polysilicon layers 149, 159 react to form titanium disilicide ($TiSi_2$). The Ti layer 320, however, does not react with pad nitride layer 130. Consequently, $TiSi_2$ is formed in regions overlying polysilicon layers 149, 159 but not in regions overlying pad nitride layer 130. Such self-aligning silicidation, for example, of titanium and polysilicon to produce $TiSi_2$, is referred to as salicidation.

In addition, the reaction of Ti layer 320 and intrinsic polysilicon layers 149, 159 to form $TiSi_2$ results in a volumetric change. Given that the relative volume of Ti is 1 and that the relative volume of Si is 2.27, the $TiSi_2$ produced has a relative volume of 2.51. Thus, if a 2000 Angstrom thick layer of Si is reacted, a 2200 Angstrom layer of $TiSi_2$ will be produced thereby forming a 200 Angstrom "overgrowth" layer. Any remaining titanium that has not reacted to form a silicide is then stripped, for example, by a sulfuric peroxide solution (sulfuric acid and hydrogen peroxide). Accordingly, as illustrated in FIG. 3C, the salicidation step and subsequent strip result in formation of first and second deep trench caps 340, 350 over first and second deep trench configurations 142, 152, respectively. The salicidation step may be controlled so that the remaining unreacted intrinsic polysilicon layers 149, 159 within trenches 140, 150 are at a level lower than the level of semiconductor substrate 110, for reasons discussed in greater detail below. The unreacted polysilicon layers 149, 159 may be used to form buried straps in subsequent processing steps.

As shown in FIG. 3D, a masking layer 360 is formed over the exterior surface of the composite body 100. In one preferred embodiment of the present invention, resist is used as the masking layer. However, it should be understood that other masking techniques may be used in connection with the present invention. A pattern of openings including opening 365 is formed in the masking layer 360 so as to expose pad nitride region 135. The masking layer profile on the first and second deep trench caps 340, 350 is inconsequential for purposes of etching, as will be clear from the discussion below, because the first and second deep trench caps 340, 350 themselves serve as masks during subsequent etching. Thus, first and second deep trench caps 340, 350 provide a tolerance range for forming opening 365 that obviates the need for meticulous adjustment of the width of the opening 365.

With reference now to FIG. 3E, a region between first and second deep trench configurations is etched to form a shallow trench 370. While FIG. 3E illustrates a shallow trench 370 having a vertical profile, it should be clear that shallow trench 370 may be formed with a tapered profile, for example, through a deposition-type etching procedure, as discussed in greater detail below. The etching step may be performed in a single step or multiple steps. For example, the etching step may proceed in two steps as will be discussed below. First, the pad nitride region 135 may be etched using a technique selective to silicon. For example, nitride, such as $Si_3N_4$, may be etched selectively against Si with primary etching gases of $CF_4$ and/or $CHF_3$. At the same time, the pad oxide region 125 may be removed by overetching.

Figure 4A:
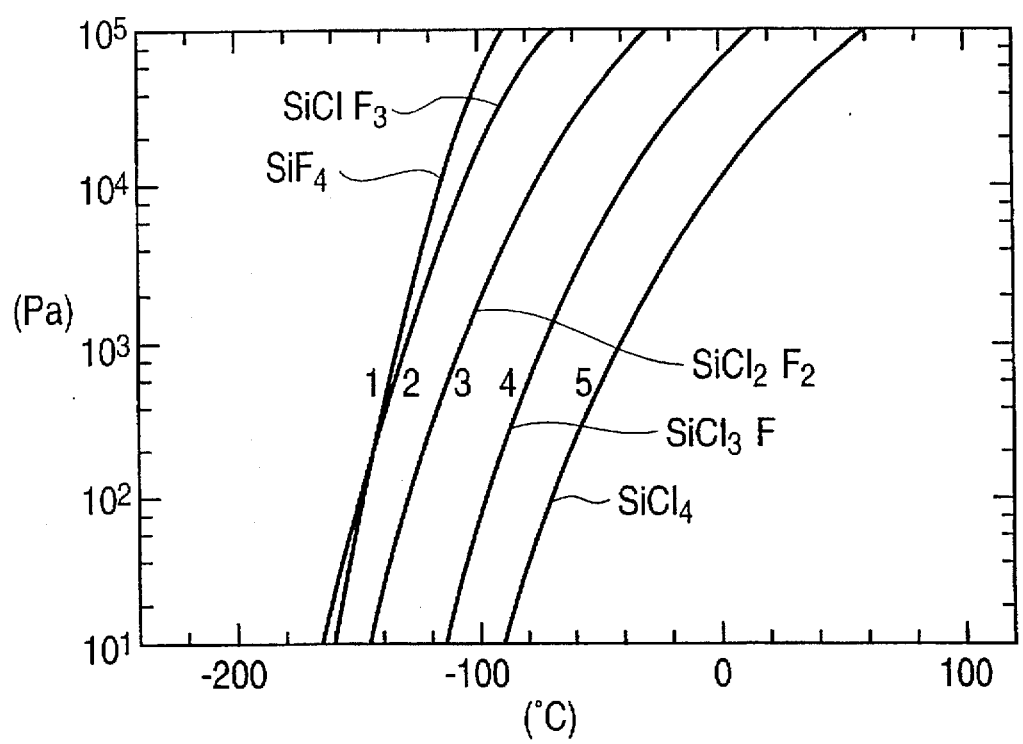
FIG. 4A illustrates a graph of the vapor pressure of $SiF_4$ as a function of temperature.
Figure 4B:
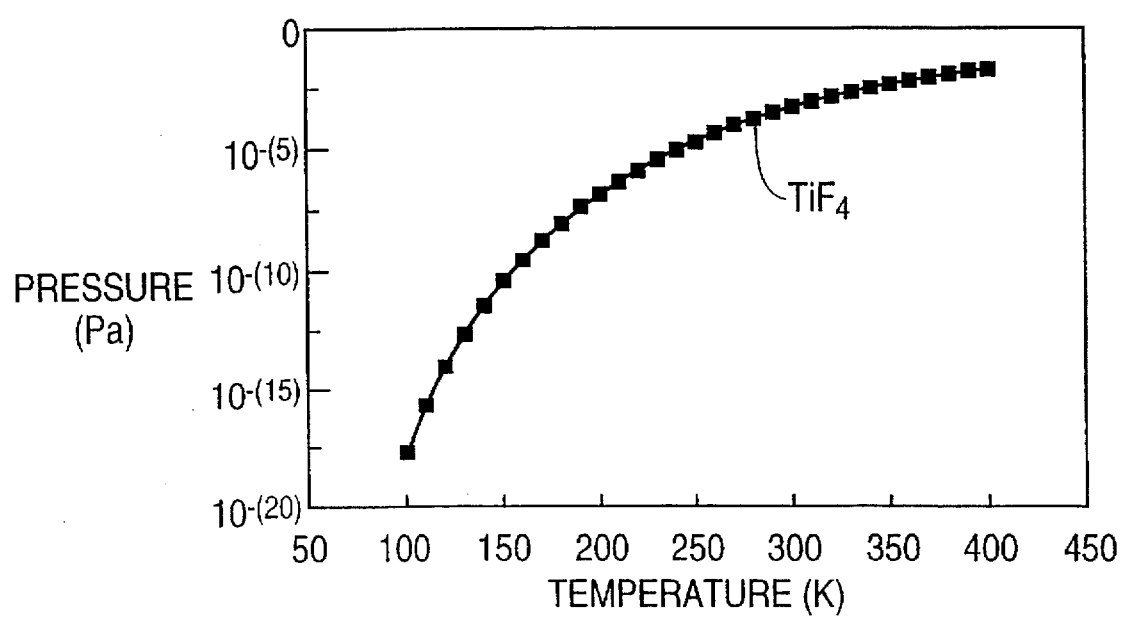
FIG. 4B illustrates a graph of the vapor pressure of $TiF_4$ as a function of temperature.

A second etching step may be selective to titanium silicide such that only silicon is etched. The second etching step may be a deposition-type RIE etch using, for example, Fluorine atoms as an etchant. FIG. 4A provides a graph illustrating the vapor pressure of $SiF_4$, the main product of an RIE etch of silicon using Fluorine, as a function of temperature. During RIE, the Fluorine atoms react with the silicon at the exposed surface of the semiconductor body to form $SiF_4$. Titanium is also reactive with the Fluorine atoms to form $TiF_4$. FIG. 4B provides a graph illustrating the vapor pressure of $TiF_4$ as a function of temperature. As can be seen by comparing FIGS. 4A and 4B, $SiF_4$ has a much higher vapor pressure as compared to $TiF_4$. Because vapor pressure represents the partial pressure below which a material evaporates, the pressure of the etching procedure can be controlled such that $SiF_4$, formed by a reaction between Si and F, evaporates immediately and that $TiF_4$, formed by a reaction between Ti and F, does not evaporate from the composite body 100. Accordingly, Si is removed from the substrate, but TI is not. Therefore, surface silicon may be removed without removal of titanium silicide. To accomplish this, the second etching step may use fluorine-based chemistry, such as $SF_6$ or $CF_4$ with $O_2$. Because the difference in vapor pressure is large, there is no practical limitation on the pressure of the etching procedure. The particular pressure may be selected based on, for example, the method of plasma generation, tool configuration, and etching performance.

By introducing depositive species (such as Fluorocarbon) into etching gases, a thin film (such as CFx) deposits on the surface. This thin film, as it builds up, inhibits etching of the material that underlies it. However, horizontal surfaces are subjected to vertical ion bombardment from the plasma, which causes the thin film to be sputtered off. Therefore, etching proceeds mainly on the horizontal surface. Tapered trenches can be realized by controlling the balance between the thin film deposition and the ion bombardment from the plasma. Accordingly, the first and second deep trench caps 340, 350, which are made of $TiSi_2$, serve as masks in the etching step. Further, the etching step can be controlled to form a tapered trench in regions surrounding an active area including a deep trench configuration and a region in which a transistor may be formed.

The masking layer 360 is stripped as illustrated in FIG. 3F and the first and second deep trench caps 340, 350 are removed, for example, using hydrofluoric (HF) acid. With the first and second deep trench caps 340, 350 removed, the intrinsic polysilicon layers 149, 159 are below the surface of the semiconductor substrate 110. This structure may simplify further processing, for example, the formation of buried straps that couple each deep trench configuration 142, 152 to adjacent source/drain regions of subsequently formed switching or gate transistors.

Figure 3G:
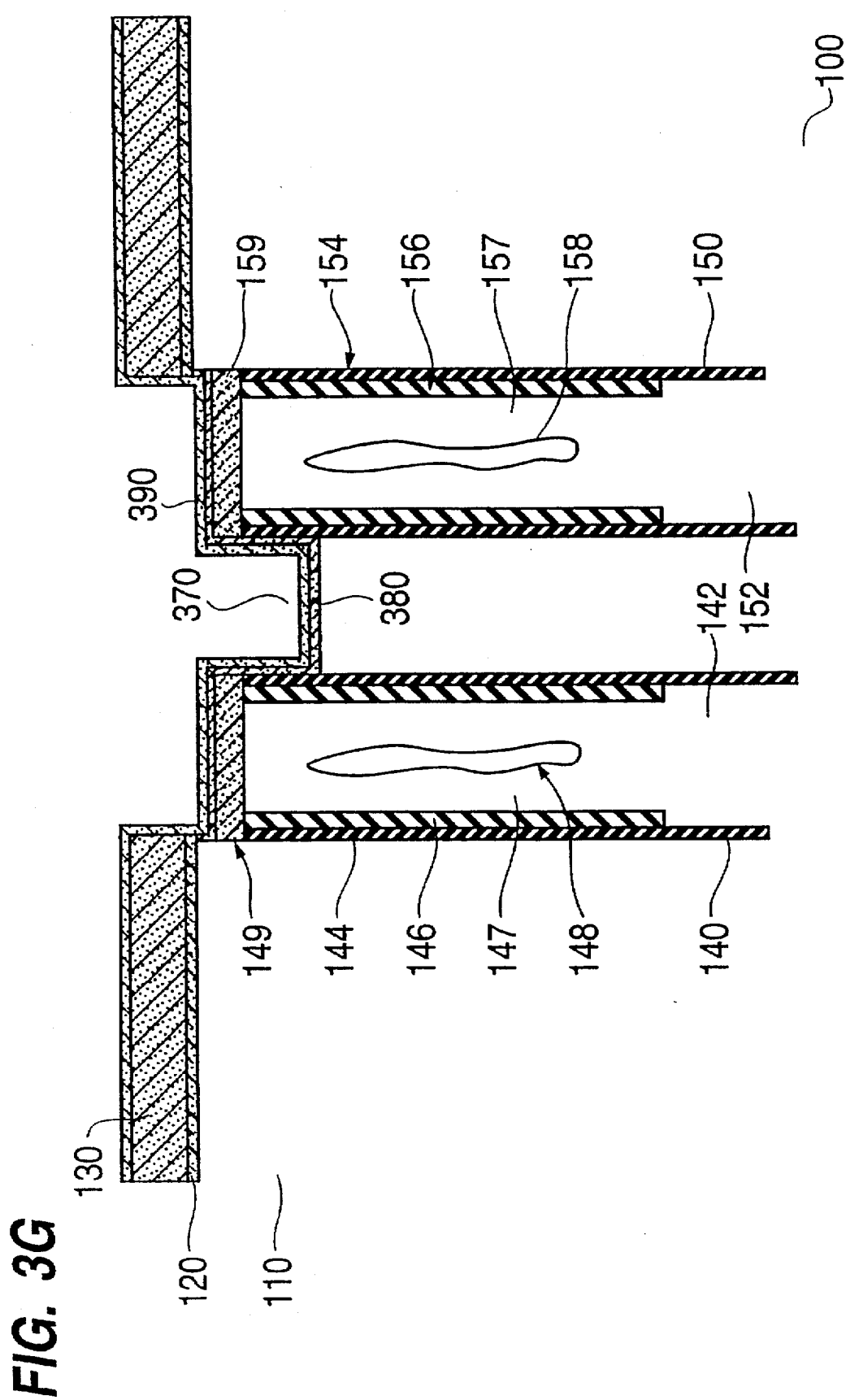

As illustrated in FIG. 3G, an oxide lining 380 is formed over polysilicon layers 149, 159 and the interior surface of trench 370. A nitride lining 390 is formed over the oxide lining 380. The oxide and nitride linings 380, 390 serve to isolate the thick oxide insulator lining 146, 156 and voids 148, 158 from oxidant, and thereby suppress dislocation and stress. Thus, a shallow trench 370 may be formed between first and second deep trench configurations 142, 152. The shallow trench 370 may be filled according to techniques known in the art. In addition, first and second memory cells, including first and second switching transistors coupled to said first and second deep trench configurations by buried straps, may be formed using processing techniques known in the art.

For example, the switching transistors may be formed adjacent the first and second deep trench configurations, respectively, opposite the shallow trench 370. For example, the shallow trench may be filled by CVD oxide. The CVD oxide deposits on the substrate conformably and, therefore, the steps formed by different surface levels of the substrate and the shallow trench are preserved. A flat upper surface may be realized by removing surplus oxide using a planarization process, for example, a CMP technique. Consequently, the shallow trenches are filled to their top surfaces. The straps as well as deep trench configurations are buried beneath the CVD oxide at this stage. The intrinsic polysilicon that forms the strap may be made conductive by out diffusion of n+ dopant from the storage nodes in a later thermal process. Thus, electrical connection between the storage node and the silicon surface (buried strap formation) is accomplished. A gate insulator may then be formed on the planar surface, and gate material may be deposited and patterned to form gate electrodes. Using the gate electrodes as masks, source/drain regions may be formed by ion implantation. Accordingly, MOS transistors including switching transistors coupled to trench capacitors are realized. Interconnection between devices and metallization to the output terminals are conducted using techniques known in the art.

The strap layers 149, 159 may be formed of a material other than intrinsic polysilicon. In such a case, intrinsic polysilicon layers may be formed over the strap layers 149, 159 for reaction with the Ti layer 320. Of course, an alternative material may be provided to react with the Ti layer 320 to form deep trench caps.

Although the present invention is generally described above with reference to forming a shallow trench between adjacent deep trench configurations, the invention is not limited in this respect. That is, the principles of this invention may be applied to form shallow trenches for isolating adjacent structures.

Although illustrative embodiments of the present invention have been described in detail with reference to the accompanying drawings, it is to be understood that the invention is not limited to those precise embodiments and that changes and modifications may be effected therein by those in the art without departing from the scope and spirit of the invention.

I claim:

1. A method of forming a shallow trench in a semiconductor substrate having first and second deep trenches each filled with at least one material, said method comprising the steps of:

planarizing an exterior surface of composite body comprising said semiconductor substrate;

forming first and second metal silicide caps over the material filling said first and second deep trenches; and forming said shallow trench between said first and second deep trenches by etching the material between said first and second deep trenches using said first and second metal silicide caps as masks to protect the material filling said first and second deep trenches from being etched during the etching.

2. The method according to claim 1, wherein said first and second deep trenches are filled with polysilicon, and said exterior surface of said composite body comprises top surfaces of the polysilicon filling said first and second deep trenches and a silicon nitride layer which is formed on said semiconductor substrate, and wherein said step of planarizing comprises planarizing the top surfaces of the polysilicon filling said first and second trenches and said silicon nitride layer to be substantially at the same level.

3. The method according to claim 2, wherein said step of forming said first and second metal silicide caps comprises forming a metal layer over the polysilicon filling said first and second deep trenches and causing said metal to react with the polysilicon filling said first and second deep trenches, thereby forming said first and second metal silicide caps only on the top of said polysilicon.

4. The method according to claim 3, wherein said metal comprises titanium and said first and second metal silicide caps comprise titanium silicide caps.

5. The method according to claim 4, wherein said semiconductor substrate comprises a silicon substrate and said step of forming said shallow trench comprises removal of unreacted titanium on the surface of said silicon nitride layer by a sulfuric peroxide solution and a reactive ion etching process which etches silicon nitride and silicon, but not titanium silicide.

6. The method according to claim 5, wherein said step of etching further comprises:

forming a photoresist masking layer having a pattern of openings over a surface of said composite body after forming said first and second titanium silicide caps, wherein the pattern of openings includes an opening exposing a portion of said first and second titanium silicide caps and the material therebetween; and etching the material between said first and second titanium silicide caps using said first and second titanium silicide deep trench caps and said photoresist layer as masks.

7. The method according to claim 6, further comprising the steps of:

stripping said first and second titanium silicide caps using hydrofluoric acid; and forming a nitride lining over an interior surface of said shallow trench.

8. The method according to claim 1, wherein said metal silicide caps comprise titanium silicide.

9. The method according to claim 1, wherein said semiconductor substrate comprises a silicon substrate and said step of forming said shallow trench comprises a reactive ion etching process for etching silicon between said first and second silicide caps to form said shallow trench between said first and second deep trenches.

10. A method of forming a shallow trench isolating structure for isolating first and second deep trenches formed in a semiconductor substrate, the method comprising the steps of:

forming silicide caps over material filling said first and second deep trenches;

forming a shallow trench between said first and second deep trenches using an anisotropic etch for etching the material between said first and second deep trenches using said silicide caps as masks to protect the material filling said first and second deep trenches from being etched; and filling said shallow trench with an insulating material.

11. A method of forming a shallow trench isolation structure, the method comprising the steps of:

forming first and second deep trenches in said semiconductor substrate;

filling said first and second deep trenches with conductive material which is insulatively spaced from said semiconductor substrate;

forming a metal layer on an upper surface of the conductive material filling said first and second deep trenches;

reacting said metal layer and a portion of said conductive material filling said first and second deep trenches to form first and second metal silicide layers on the unreacted portions of said conductive material filling said first and second deep trenches, respectively;

etching the portion of said semiconductor substrate between said first and second deep trenches using said first and second metal silicide layers as a mask to form a shallow trench;

removing said first and second metal silicide layers; and filling said shallow trench with an insulator.

12. The method according to claim 11, comprising the further step of:

forming a liner in said shallow trench before filling said shallow trench with an insulator.

13. The method according to claim 11, wherein said liner comprises a nitride layer.

14. The method according to claim 11, wherein said liner comprises an oxide layer and a nitride layer.

15. A method of forming a shallow trench isolation structure in a semiconductor substrate, the method comprising the steps of:

forming first and second deep trenches in said semiconductor substrate onto which a pad layer is formed;

filling said first and second deep trenches with conductive material;

planarizing upper surfaces of said pad layer and the conductive material filling said first and second deep trenches;

forming a metal layer on the planarized upper surfaces of said pad layer and the conductive material filling said first and second deep trenches;

reacting said metal layer and a portion of said conductive material filling said first and second deep trenches to form first and second metal silicide layers on the unreacted portions of said conductive material filling said first and second deep trenches, respectively;

stripping the unreacted portions of said metal layer from the upper surface of said pad layer;

forming a masking layer on upper surfaces of said pad layer and said first and second metal silicide layers;

patterning said masking layer to have an opening which at least exposes the portion of said pad layer between said first and second deep trenches;

etching said pad layer and said semiconductor substrate using said patterned masking layer and said first and second metal silicide layers as a mask to form a shallow trench;

removing said masking layer and first and second metal silicide layers; and filling said shallow trench with an insulator.

16. The method according to claim 15, wherein said shallow trench has tapered sidewalls.

17. The method according to claim 15, comprising the further step of:

forming a liner in said shallow trench before filling said shallow trench with an insulator.

18. The method according to claim 15, wherein said metal layer and said conductive material filling said first and second deep trenches are reacted such that a level of the unreacted portions of said conductive material filling said first and second deep trenches is lower than a level of the surface of said semiconductor substrate on which said pad layer is formed.

19. The method according to claim 15, wherein said masking layer comprises a photoresist.

20. The method according to claim 15, wherein said shallow trench is filled by an oxide which is deposited using chemical vapor deposition.

* * * * *